United States Patent
Matero et al.

(10) Patent No.: US 8,501,637 B2
(45) Date of Patent: Aug. 6, 2013

(54) SILICON DIOXIDE THIN FILMS BY ALD

(75) Inventors: Raija H. Matero, Vantaa (FI); Suvi P. Haukka, Helsinki (FI)

(73) Assignee: ASM International N.V. (NL)

( * ) Notice: Subject to any disclaimer, the term of this patent is extended or adjusted under 35 U.S.C. 154(b) by 0 days.

(21) Appl. No.: 12/340,551

(22) Filed: Dec. 19, 2008

(65) Prior Publication Data

US 2009/0209081 A1 Aug. 20, 2009

Related U.S. Application Data

(60) Provisional application No. 61/015,966, filed on Dec. 21, 2007.

(51) Int. Cl.
H01L 21/26 (2006.01)

(52) U.S. Cl.
USPC .................... 438/789; 438/790; 257/E21.278

(58) Field of Classification Search
USPC .................................................. 438/789, 790
See application file for complete search history.

(56) References Cited

U.S. PATENT DOCUMENTS

| | | | |
|---|---|---|---|
| 4,467,238 A | 8/1984 | Silverstein et al. |
| 5,187,241 A | 2/1993 | Buchwalter et al. |
| 5,480,818 A | 1/1996 | Matsumoto et al. |
| 5,496,582 A | 3/1996 | Mizutani |
| 5,496,597 A | 3/1996 | Soininen et al. |
| 5,505,991 A | 4/1996 | Schmid et al. |
| 5,536,673 A | 7/1996 | Hong et al. |
| 5,603,750 A | 2/1997 | Sierakowski et al. |
| 5,759,903 A | 6/1998 | Lehmann et al. |
| 5,891,744 A | 4/1999 | Lowrey et al. |
| 5,917,571 A | 6/1999 | Shimada |
| 5,928,791 A | 7/1999 | Rosenmayer |
| 5,972,430 A | 10/1999 | DiMeo et al. |
| 6,006,763 A | 12/1999 | Mori et al. |
| 6,015,590 A | 1/2000 | Suntola et al. |
| 6,174,809 B1 | 1/2001 | Kang et al. |
| 6,203,613 B1 | 3/2001 | Gates et al. |
| 6,207,487 B1 | 3/2001 | Kim et al. |
| 6,313,035 B1 | 11/2001 | Sandhu et al. |
| 6,492,528 B1 | 12/2002 | Matsuba et al. |
| 6,537,613 B1 | 3/2003 | Senzaki et al. |
| 6,613,383 B1 | 9/2003 | George et al. |
| 6,780,476 B2 | 8/2004 | Horikawa |

(Continued)

FOREIGN PATENT DOCUMENTS

| | | |
|---|---|---|
| GB | 2332980 | 7/1999 |
| JP | 53-148282 | 12/1978 |

(Continued)

OTHER PUBLICATIONS

Esaki et al., "Superlattice and Negative Differential Conductivity in Semiconductors", IMB J. Res. Develop., Jan. 1970.

(Continued)

*Primary Examiner* — Alexander Ghyka
(74) *Attorney, Agent, or Firm* — Knobbe, Martens, Olson & Bear, LLP

(57) ABSTRACT

Methods are provided for depositing silicon dioxide containing thin films on a substrate by atomic layer deposition ALD. By using disilane compounds as the silicon source, good deposition rates and uniformity are obtained.

29 Claims, 10 Drawing Sheets

(56) References Cited

U.S. PATENT DOCUMENTS

| | | | |
|---|---|---|---|
| 6,780,704 B1 | 8/2004 | Raaijmakers et al. | |
| 6,818,517 B1 | 11/2004 | Maes | |
| 6,835,417 B2 | 12/2004 | Saenger et al. | |
| 6,849,305 B2 | 2/2005 | Bravo-Vasquez et al. | |
| 6,858,546 B2 | 2/2005 | Niinisto et al. | |
| 7,045,170 B1 | 5/2006 | Hankins et al. | |
| 7,045,430 B2 | 5/2006 | Ahn et al. | |
| 7,268,047 B2 | 9/2007 | Arikado et al. | |
| 7,507,848 B2 | 3/2009 | Gordon | |
| 2005/0271813 A1 | 12/2005 | Kher et al. | |
| 2006/0030724 A1 | 2/2006 | Dussarrat et al. | |
| 2006/0138572 A1 | 6/2006 | Arikado et al. | |
| 2006/0178019 A1* | 8/2006 | Senzaki et al. | 438/788 |
| 2006/0211259 A1 | 9/2006 | Maes et al. | |
| 2006/0228888 A1 | 10/2006 | Lee et al. | |
| 2006/0286776 A1* | 12/2006 | Ranish et al. | 438/478 |

FOREIGN PATENT DOCUMENTS

| | | |
|---|---|---|
| JP | 60-065712 | 4/1985 |
| JP | 03-082769 | 4/1991 |
| JP | 03-286531 | 12/1991 |
| JP | 06-080413 | 3/1994 |
| WO | WO 01/99166 | 12/2001 |
| WO | WO 2004/017378 | 2/2004 |
| WO | WO2004044958 | 5/2004 |
| WO | WO 2006/097525 | 9/2006 |
| WO | WO2007002040 | 1/2007 |

OTHER PUBLICATIONS

Gasser et al., "Quasi-Monolayer Deposition of Silicon Dioxide", Thin Solid Films, 1994, Issue 250, pp. 213-218.

George et al., "Atomic Layer Controlled Deposition of SiO2 and Al2O3 Using ABAB . . . . Binary Reaction Sequence Chemistry", Appl. Surf. Science, 1994, Issue 82/83, pp. 460-467.

George et al., "Surface Chemistry for Atomic Layer Growth", J. Phys. Chem., 1996, Issue 100, pp. 13121-13131.

Jeon, "A Study on the Characteristics of TiN Thin Film Deposited by Atomic Layer Chemical Vapor Deposition Method", AVS 46th International Symposium, 1999, Issue abstract TF-MoP17, Seattle, WA.

Jeon et al., "A Study on the Characteristics of TiN Thin Film Deposited by Atomic Layer Chemical Vapor Deposition Method", J. Vac. Sci. Technol. A, 2000, vol. 18, Issue 4, pp. 1595-1598.

Klaus et al., "Atomic Layer Deposition of $SiO_2$ Using Catalyzed and Uncatalyzed Self-Limiting Surface Reactions", Surface Review and Letters, 1999, vol. 6, Issue 3 & 4, pp. 435-448.

Klaus et al., "Atomically Controlled Growth of Tungsten and Tungsten Nitride Using Sequential Surface Reactions", Appl. Surf. Science, 2000, Issue 162-163, pp. 479-491.

Klaus et al., "Atomic Layer Deposition of Tungsten Nitride Films Using Sequential Surface Reactions", Journal of the Electrochemical Soc., 2000, vol. 147, Issue 3, pp. 1175-1181.

Klaus et al., "Atomic Layer Deposition of Tungsten Using Sequential Surface Chemistry with a Sacrificial Stripping Reaction", Thin Solid Films, 2000, Issue 360, pp. 145-153.

Klaus et al., "Atomic Layer Deposition of Tungsten and Tungsten Nitride Using Sequential Surface Reactions", AVS 46th International Symposium, 1999, Issue abstract TF-TuM6, Seattle, WA.

Leskela et al., "Atomic Layer Epitaxy in Deposition of Various Oxide and Nitride Thin Films", Journal De Physique IV, 1995, vol. 5, pp. 937-951.

Leskela et al., "ALD Precursor Chemistry: Evolution and Future Challenges", J. Phys. IV France 9, 1999, pp. 837-847.

Morishita et al., "New Substances for Atomic-Layer Deposition of Silicon Dioxide", Journal of Non- Chrystalline Solids, 1995, pp. 66-69.

Nieminen et al., "Formation and Stability of Lanthanum Oxide Thin Films Deposited from β-Diketonate Precursor", Applied Surface Science, 2001, Issue 6915, pp. 1-12.

Niinisto et al., "Synthesis of Oxide Thin Films and Overlayers by Atomic Layer Epitaxy for Advanced Applications", Materials Science and Engineering, 1996, Issue B41, pp. 23-29.

Putkonen et al., "Low-Temperature ALE Deposition of Y2O3 Thin Films from β-Diketonate Precursors", Chemical Capor Deposition, 2001, pp. 44-50.

Riihela et al., "Introducing Atomic Layer Epitaxy for the Deposition of Optical Thin Films", Thin Solid Films, 1996, vol. 289, pp. 250-255.

Ritala et al., "Growth of Titanium Dioxide Thin Films by Atomic Layer Epitaxy", Thin Solid Films, 1993, Issue 225, pp. 288-295.

Ritala et al., "Zirconium Dioxide Thin Films Deposited by ALE Using Zirconium Tetrachloride as Precursor", Applied Surface Science, 1994, Issue 75, pp. 333-340.

Suntola, "Atomic Layer Epitaxy", Materials Science Reports, 1989, vol. 4, Issue 7, pp. 261-312.

Wise et al., "Diethyldiethoxysilane as a New Precursor for $SiO_2$ Growth on Silicon", Mat. Res. Soc. Symp. Proc., 1994, vol. 334, pp. 37-43.

Yamaguchi et al., "Atomic-Layer Chemical-Vapor-Deposition of Silicon Dioxide Films with an Extremely Low Hydrogen Content", Appl. Surf. Science, 1998, Issue 130-132, pp. 202-207.

U.S. Appl. No. 10/148,525, filed Aug. 27, 2002, titled "Method of Growing Oxide Films", listing as inventor Tois et al.
Office Action for U.S. Appl. No. 10/148,525, dated Feb. 13, 2004.
Office Action for U.S. Appl. No. 10/148,525, dated Sep. 28, 2004.
Office Action for U.S. Appl. No. 10/148,525, dated Jun. 14, 2005.
Office Action for U.S. Appl. No. 10/148,525, dated Sep. 30, 2005.
Office Action for U.S. Appl. No. 10/148,525, dated Sep. 18, 2006.
Office Action for U.S. Appl. No. 10/148,525, dated Jun. 1, 2007.
Office Action for U.S. Appl. No. 10/148,525, dated Feb. 26, 2008.
Office Action for U.S. Appl. No. 10/148,525, dated Jun. 10, 2008.
Office Action for U.S. Appl. No. 10/148,525, dated Sep. 22, 2008.
Office Action for U.S. Appl. No. 10/148,525, dated Jun. 25, 2009.
U.S. Appl. No. 10/678,766, filed Oct. 2, 2003, titled "Method of Growing Oxide Thin Films", listing as inventor Tois et al.
Office Action for U.S. Appl. No. 10/678,766, dated Sep. 28, 2004.
Office Action for U.S. Appl. No. 10/678,766, dated Mar. 24, 2005.
Office Action for U.S. Appl. No. 10/678,766, dated Jul. 20, 2005.
Office Action for U.S. Appl. No. 10/678,766, dated Apr. 4, 2006.
Office Action for U.S. Appl. No. 10/678,766, dated Dec. 28, 2006.
Office Action for U.S. Appl. No. 10/678,766, dated Jul. 13, 2007.
Office Action for U.S. Appl. No. 10/678,766, dated Jan. 24, 2008.
Office Action for U.S. Appl. No. 10/678,766, dated Nov. 18, 2008.
Office Action for U.S. Appl. No. 10/678,766, dated May 1, 2009.
Office Action for U.S. Appl. No. 10/678,766, dated Jun. 26, 2009.
U.S. Appl. No. 11/615,827, filed Dec. 22, 2006, titled "Method of Growing Oxide Thin Films", listing as inventor Tois et al.
Office Action for U.S. Appl. No. 11/615,827, dated Apr. 18, 2008.
Office Action for U.S. Appl. No. 11/615,827, dated Oct. 31, 2008.
Office Action for U.S. Appl. No. 11/615,827, dated Jul. 13, 2009.

* cited by examiner

| Temperature (°C) | C (%) | N (%) | Si:O |
|---|---|---|---|
| 150 | <0.5 | <2 | 0.51 |
| 200 | <0.5 | <2 | 0.50 |
| 250 | 0.6 | <2 | 0.50 |
| 300 | 0.6 | <2 | 0.50 |

| Temperature (°C) | XRR Density (g/cm³) |
|---|---|
| 150 | 1.9 |
| 200 | 1.93 |
| 250 | 2.03 |
| 300 | 1.92 |

SILICON DIOXIDE THIN FILMS BY ALD

REFERENCE TO RELATED APPLICATIONS

The present application claims priority under 35 U.S.C. §119(e) to U.S. Provisional Application No. 61/015,966 filed Dec. 21, 2007, entitled SILICON DIOXIDE THIN FILMS BY ALD, which is hereby incorporated by reference in its entirety.

BACKGROUND OF INVENTION

1. Field of the Invention

The present disclosure provides methods for depositing oxide thin films by atomic layer deposition (ALD). More particularly thin films comprising silicon dioxide are deposited using disilane compounds.

2. Description of the Related Art

Silicon dioxide is a widely used material in semiconductor industry. It is used for instance as gate oxide and a dielectric layer in dynamic random access memories (DRAM). Recently, other possible applications have evolved that would require good step coverage and good $SiO_2$ filling capabilities, for example shallow trench isolation (STI). Atomic layer deposition (ALD) has been proposed as a possible technique to meet these more stringent requirements. Unfortunately, the growth rate per cycle has traditionally been low for ALD $SiO_2$ processes making the processing economically non-viable. New precursors with higher reactivity enabling higher growth rate are therefore needed.

In its various forms Chemical Vapor Deposition (CVD) is the most frequently used method of producing silicon dioxide (see patent publications JP 9306906, U.S. Pat. No. 4,845,054, U.S. Pat. No. 4,981,724, U.S. Pat. No. 5,462,899, JP 20868486, JP 6158329, JP 80061810, U.S. Pat. No. 4,872,947, JP 7026383, U.S. Pat. No. 5,855,957 and U.S. Pat. No. 5,849,644). Mainly tetraethoxy silane (TEOS) has been used as the silicon source material, and oxygen, water, hydrogen peroxide or ozone have been used as the oxygen source material in the patent publications. In the conventional CVD the oxygen source material is always brought simultaneously with the silicon source material to the growth substrate.

Conventional CVD methods provide neither sufficiently good coverage nor the level of conformality desired for some applications.

Atomic layer deposition (ALD), originally known as atomic layer epitaxy (ALE), is an advanced form of vapor deposition. ALD processes are based on sequential, self-saturated surface reactions. Examples of these processes are described in detail in U.S. Pat. Nos. 4,058,430 and 5,711,811. Due to the self-saturating nature of the process, ALD enables almost perfectly conformal deposition of films on an atomic level and precise control of the thickness and composition of the deposited films.

Silicon dioxide has been grown by ALD processes using compounds such as $Si(NCO)_4$ and $N(C_2H_5)_3$ (K. Yamaguchi et al., Appl. Surf. Sci. (1998) 130-132) as source materials. Deposition of silicon dioxide by Molecular Layer ALE and UHV-ALE processes using $SiCl_4$ and $H_2O$ as source materials is also described in the literature (Surface Review and Letters, Vol. 6, Nos 3 & 4 (1999) 435-448). However, these processes have long reaction times and cannot be realized on an industrial scale.

SUMMARY OF INVENTION

According to one aspect of the invention, methods for depositing a thin film comprising silicon oxide on a substrate by atomic layer deposition are provided. The methods generally comprise contacting a substrate in a reaction space with a first reactant that includes a silicon source chemical, preferably a disilane compound as described herein, and a second reactant comprising an oxygen source, thereby forming the silicon oxide thin film on the substrate.

According to some embodiments of the invention, atomic layer deposition (ALD) processes for growing a thin film over a substrate are provided. The methods generally comprise alternately and sequentially contacting a substrate in a reaction space with vapor phase pulses of an amino disilane compound, such as hexakis(ethylamino)disilane, that forms no more than about one molecular layer on the structural surface of the substrate, and a second reactant comprising a reactive oxygen source, such as ozone.

For purposes of summarizing the invention and the advantages achieved over the prior art, certain objects and advantages of the invention have been described herein. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of the embodiments described herein are intended to be within the scope of the invention herein disclosed. These and other embodiments of the present invention will be readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

These and other aspects of the invention will be readily apparent to the skilled artisan in view of the description below and the appended drawings, which are meant to illustrate and not to limit the invention, and in which:

FIGS. 7A-7C are enlarged portions of FIG. 7D.

DETAILED DESCRIPTION

Figure 1:
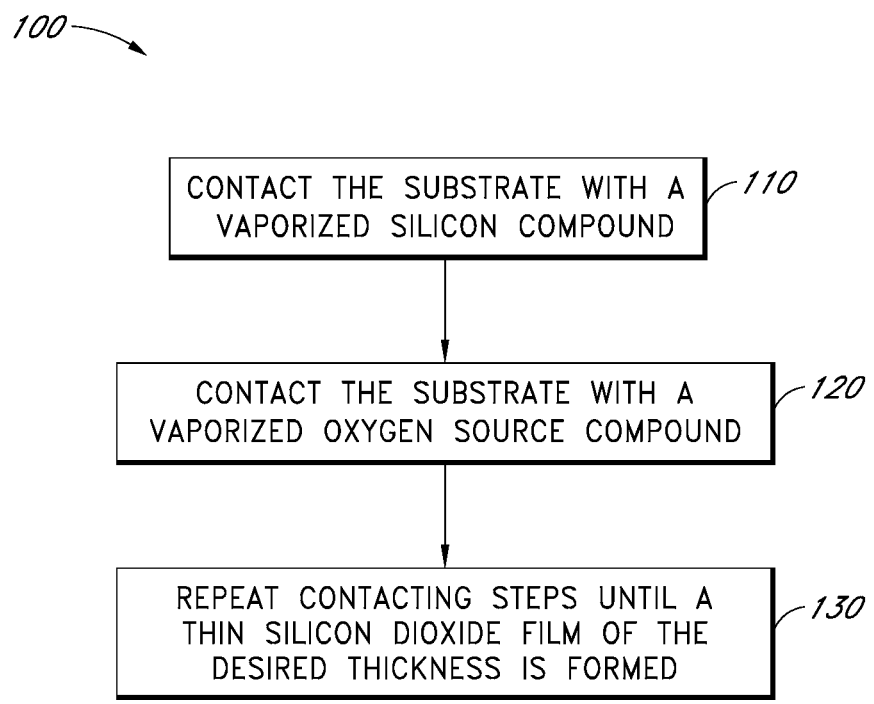
FIG. 1 is a block diagram of a pulsing sequence in an ALD-type process according to some embodiments of the invention.

ALD type processes are based on controlled, self-limiting surface reactions of precursor chemicals. Gas phase reactions are avoided by feeding the precursors alternately and sequentially into the reaction chamber. Vapor phase reactants are separated from each other in the reaction chamber. Excess reactants and/or reactant byproducts are typically removed from the reaction chamber between reactant pulses.

ALD processes are preferred to chemical vapor deposition processes (CVD) in some applications because the self limiting nature of ALD processes provides advantages such as greater control of film growth and better surface coverage.

Silicon dioxide thin films and films comprising silicon dioxide are grown in an ALD reactor, preferably at the temperature of about 20-500° C., more preferably about 150-350° C., still more preferably about 250-300° C. Even flat (such as glass or wafer) or grooved flat materials can be used as a substrate. On the surface of the substrate can also exist a so-called HSG (hemispherical grain) structure on which the film is grown. Additionally, a powdery material, which has a large surface area, can be used as a substrate. The term "growth substrate" designates in this invention the surface on which the thin film is grown. The surface can consist of the above-mentioned substrate or of a thin film grown onto the substrate or of another structure.

Silicon dioxide has a wide variety of applications, as will be apparent to the skilled artisan. For example it may be used to fill trenches as in STI (shallow trench isolation), as discussed below, or in forming spacers. Although several examples are described herein, other applications will be apparent to the skilled artisan.

Silicon dioxide can be used in STI structures. The function of STI is to isolate the transistors from each other in both the circuit and memory structures. At present in the lateral direction wide so-called LOCOS isolation is in use, which isolation is not suitable in the future circuits because of its bulkiness. In STI technology a horizontal narrow deep trench filled with dielectric=silicon dioxide, is etched between the circuits. Since the depth of the trench is greater than the width STI requires a method which is capable of filling the etched isolation trench conformally. By the conventional CVD method STI trenches can be filled but often the trench has to be widened in the upper part in order to avoid void formation in the middle of the STI isolation. Enlargement of the trench leads to increase of the STI area, i.e., the area of the isolation area increases. ALD is an especially suitable process for producing STI because ALD is characterized by the ability to grow silicon dioxide of uniform quality and without void formation on uneven growth substrates, especially also onto narrow trenches. Using ALD enables thus a narrower isolation area between the circuits whereby the packing density of the circuits can be increased.

In the components needed in magnetic recording, silicon dioxide can be used as the isolation layer in both the writing/reading head and in the encapsulation of the writing/reading head. In order to avoid the destruction of the magnetic properties of the layers, that are already built, the processing temperature must be low in all steps. In general, physical (sputtering) methods are used in the field, the problem of said methods being the unevenness of produced film. ALD has the capability to produce both physically and electrically homogenous thin films. It is especially preferable to use a relatively low temperature ALD silicon dioxide process that provides a uniformly covering and electrically homogenous $SiO_2$ thin film. In this way the reproducibility and reliability of this process step can be increased.

Film deposition methods producing uniform thin film on a large surface are needed for field emission displays (FED). Due to the relatively low growth temperature and the uniformity of the silicon dioxide film produced, the ALD silicon dioxide processes disclosed herein are suitable for preparing the dielectric layer for field emission displays.

Definitions

For the purpose of the present description, an "ALD process" designates a process in which deposition of material onto a surface is based on sequential and alternating self-saturating surface reactions. The general principles of ALD are disclosed, e.g., in U.S. Pat. Nos. 4,058,430 and 5,711,811, the disclosures of which are incorporated herein by reference. Generally, conditions for ALD include a temperature window wherein the substrate is above the temperature at which source gases condense and below the temperature at which the source gases thermally decompose.

"Reaction space" is used to designate a reactor or reaction chamber, or an arbitrarily defined volume therein, in which conditions can be adjusted to effect thin film growth by ALD. Typically the reaction space includes surfaces subject to all reaction gas pulses from which gases or particles can flow to the substrate, by entrained flow or diffusion, during normal operation.

"Adsorption" is used to designate a chemical attachment of atoms or molecules on a surface.

"Surface" is used to designate a boundary between the reaction space and a feature of a substrate.

"Thin film" means a film that is grown from elements or compounds that are transported as separate ions, atoms or molecules via vacuum, gaseous phase or liquid phase from the source to the substrate. The thickness of the film depends upon the application and may vary in a wide range, preferably from about one molecular layer to 1,000 nm.

Preferred ALD Methods

The methods presented herein allow deposition of silicon dioxide films on substrate surfaces. Geometrically challenging applications are also possible due to the self-limited nature of the surface reactions. According to the preferred embodiments, atomic layer deposition (ALD) type processes are used to form silicon dioxide films on substrates, such as integrated circuit workpieces.

A substrate or workpiece placed in a reaction chamber is subjected to alternately repeated surface reactions. In particular, thin films are formed by repetition of a self-limiting ALD cycle. Preferably, each ALD cycle comprises at least two distinct phases. One reactant will form no more than about one monolayer on the substrate surface and includes silicon. This reactant, also referred to herein as "the silicon reactant," is preferably a disilane compound and in some embodiments is hexakis(ethylamino)disilane. A second reactant comprising a reactive oxygen species converts the adsorbed silicon compound to silicon dioxide. In the case of multicomponent oxide thin film deposition, at least three different source chemicals are alternatively employed, corresponding to three phases.

In preferred embodiments the substrate on which deposition is desired, preferably a semiconductor workpiece, is loaded into a reactor. The reactor may be part of a cluster tool in which a variety of different processes in the formation of an integrated circuit are carried out. In some embodiments a flow-type reactor is utilized. In some embodiments a high-volume manufacturing capable single wafer ALD reactor is used. In other embodiments a batch reactor comprising multiple substrates is used. The substrate size may be, for example, greater than or equal to 200 mm and preferably is in the range of about 200 mm to about 675 mm. More preferably the substrate size is 300 mm. However, in some cases, such as for applications outside of integrated circuits like solar cells and display technology, the substrate size can be in the range of about 500×500 mm² to about 2000×2000 mm² or even more. For embodiments in batch ALD reactors, the number of substrates is preferably in the range of 10 to 200, more preferably in the range of 50 to 150, and most preferably in the range of 100 to 130.

Exemplary single wafer reactors, designed specifically to enhance ALD processes, are commercially available from ASM America, Inc. (Phoenix, Ariz.) under the tradenames Pulsar® 2000 and Pulsar® 3000. Exemplary batch ALD reactors, designed specifically to enhance ALD processes, are commercially available from and ASM Europe B.V (Almere, Netherlands) under the tradenames A4ALD™ and A412™.

In some embodiments, if necessary, the exposed surfaces of the workpiece can be terminated to react with the first phase of the ALD process. In some embodiments a separate termination step is not required.

After the initial surface termination, if necessary, a first reactant pulse is supplied to the workpiece. In accordance with some embodiments, the first reactant pulse comprises a carrier gas flow and a volatile silicon species, preferably an amino disilane compound, that is reactive with the workpiece surfaces of interest. Accordingly, the disilane compound adsorbs upon the workpiece surfaces. The first reactant pulse self-saturates the workpiece surfaces such that any excess constituents of the first reactant pulse do not further react with the molecular layer formed by this process.

The first silicon reactant pulse is preferably supplied in gaseous form. The silicon reactant gas is considered "volatile" for purposes of the present description if the species exhibits sufficient vapor pressure under the process conditions to transport the species to the workpiece in sufficient concentration to saturate exposed surfaces.

After sufficient time for a molecular layer to adsorb on the substrate surface, the first reactant is then removed from the reaction space. In some embodiments the flow of the first chemistry is stopped while continuing to flow a carrier gas for a sufficient time to diffuse or purge excess reactants and reactant by-products, if any, from the reaction space, preferably with greater than about two reaction chamber volumes of the purge gas, more preferably with greater than about three chamber volumes.

The pulse and purge times used can vary depending on the type of reactor. For example, pulse/purge times are usually shorter in embodiments with single wafer reactors. Pulse/purge times are usually longer in embodiments with batch reactors because multiple substrates are processed.

Typically, the silicon reactant pulsing time is from about 0.05 to about 180 seconds. However, depending on the reactor type, substrate type and its surface area, the pulsing time may be even higher than 180 seconds. In some embodiments, pulsing times can be on the order of minutes. The optimum pulsing time can be readily determined by the skilled artisan based on the particular circumstances.

In some embodiments, the silicon reactant in single wafer reactors is provided with a pulse length of from about 0.1 to about 5 seconds, more preferably about 0.3 to about 1.5 seconds.

In some embodiments, the silicon reactant in batch ALD reactors is provided with a pulse length of from about 1 to about 180 seconds, more preferably about 10 to about 60 seconds.

In some embodiments the removal of excess reactant comprises continuing to flow purge gas for between about 0.1 seconds and 20 seconds after stopping the flow of the first silicon reactant pulse. Together, the adsorption and reactant removal represent a first phase in an ALD cycle, and can be referred to as the silicon phase. Longer purge times than 20 seconds may be used in some embodiments, for example for batch ALD processes.

In the second phase, a second reactant pulse is then supplied to the workpiece. The second chemistry comprises an oxygen source which desirably reacts with or adsorbs upon the molecular layer left by the first reactant to form silicon dioxide. In some embodiments the second reactant pulse comprises supplying ozone to the workpiece, for example with the aid of a carrier gas. In some embodiments ozone is provided as a mixture of ozone and oxygen (or an inert gas), comprising an ozone concentration of about 5 vol-% to about 40 vol-%. As discussed below, other oxygen sources, such as atomic oxygen, oxygen plasma or oxygen radicals, can be used.

Typically, the oxygen source pulsing time is from about 0.05 to about 180 seconds. However, depending on the reactor type, substrate type and its surface area, the pulsing time may be even higher than 180 seconds. In some embodiments, pulsing times can be on the order of minutes. The optimum pulsing time can be readily determined by the skilled artisan based on the particular circumstances.

The pulse length of the oxygen source compound in a single wafer reactor is preferably from about 0.1 to about 5 seconds, more preferably from about 0.3 to about 1.5 seconds. The pulse length of the oxygen source compound in a batch ALD reactor is preferably from about 1 to about 60 seconds, more preferably from about 5 to about 30 seconds.

After a time period sufficient to completely saturate and react the molecular layer with the second reactant pulse, any excess second reactant is removed from the reaction space. As with the removal of the first reactant, this step may comprise stopping the flow of the second reactant and continuing to flow carrier gas for a time period sufficient for excess reactants and volatile reaction by-products from the second reactant pulse to diffuse out of and be purged from the reaction space. In some embodiments the removal of excess reactant comprises continuing to flow purge gas for between about 0.1 seconds and 20 seconds after stopping the flow of the second reactant pulse. Together, the second reactant pulse and removal represent a second phase in the illustrated process, and can also be considered the oxidation phase.

The two phases together represent one ALD cycle, which is repeated to form silicon oxide thin films of the desired thickness. While the ALD cycle is generally referred to herein as beginning with the silicon phase, it is contemplated that in other embodiments the cycle may begin with the oxidation phase. One of skill in the art will recognize that the first reactant phase generally reacts with the termination left by the second phase in the previous cycle. Thus, while no reactant may be previously adsorbed on the substrate surface or present in the reaction space if the oxidation phase is the first phase in the first ALD cycle, in subsequent cycles the oxidation phase will effectively follow the silicon phase.

FIG. 1 is a flow chart generally illustrating a method for forming a silicon dioxide thin film in accordance with one embodiment. According to a preferred embodiment, a silicon dioxide thin film is formed on a substrate by an ALD type process 100 comprising multiple silicon dioxide deposition cycles, each silicon dioxide deposition cycle comprising:

contacting a substrate with a vaporized silicon compound such that the silicon compound adsorbs to the substrate; and converting the adsorbed silicon compound into silicon dioxide by contacting it with a reactive vaporized oxygen source compound This can be referred to as the silicon dioxide deposition cycle. In the silicon dioxide deposition cycle 100, the substrate is contacted with a vaporized silicon compound 110. Any of the silicon precursors described herein can be used. Next, the adsorbed silicon compound can be converted to silicon dioxide by contacting the substrate with a vaporized oxygen source compound 120. Any of the oxygen precursors described herein can be used as the oxygen source compound. The contacting steps are repeated 130 until a thin film of a desired thickness and composition is obtained.

Although described above in terms of two reactants, it will be understood that, in some embodiments, additional chemistries can also be included in each cycle or in various cycles throughout the deposition process. For example, if necessary, the cycle can be extended to include a distinct surface preparation. Moreover, one or more additional phases can be conducted in each cycle. For example, as discussed below, additional phases may be included that add additional components to the growing thin film, such as additional oxides to form a multicomponent oxide film.

The deposition can be carried out at a wide range of pressure conditions, but it is preferred to operate the process at reduced pressure. The pressure in the reaction chamber is typically from about 0.01 to about 500 mbar or more. However, in some cases the pressure will be higher or lower than this range, as can be readily determined by the skilled artisan. The pressure in a single wafer reactor is preferably maintained between about 0.01 mbar and 50 mbar, more preferably between about 0.1 mbar and 10 mbar. The pressure in a batch ALD reactor is preferably maintained between about 1 mTorr and 500 mTorr, more preferably between about 30 mTorr and 200 mTorr.

The deposition temperature is kept low enough to prevent thermal decomposition of the gaseous source chemicals. On the other hand, the deposition temperature is kept high enough to provide activation energy for the surface reactions, to prevent the physisorption of source materials and minimize condensation of gaseous reactants in the reaction space. Depending on the reactants and reactors, the deposition temperature is typically about 20° C. to about 500° C., preferably about 150° C. to about 350° C., more preferably about 250° C. to about 300° C.

The silicon source temperature is preferably set below the deposition or substrate temperature. This is based on the fact that if the partial pressure of the source chemical vapor exceeds the condensation limit at the substrate temperature, controlled layer-by-layer growth of the thin film is compromised. In some embodiments, the silicon source temperature is from about 30 to about 150° C. In some embodiments the silicon source temperature is greater than about 60° C. during the deposition. In some embodiments, where greater doses are needed, for example in batch ALD, the silicon source temperature is from about 90° C. to about 200° C., preferably from about 130° C. to about 170° C.

In some embodiments the growth rate of the thin film comprising silicon dioxide is preferably above 0.7 Å/cycle. In other embodiments the growth rate is above 0.8 Å/cycle and in still other embodiments the growth rate is above 1.0 Å/cycle, and preferably in the range of 1.0 to 1.2 Å/cycle.

In some embodiments the deposited thin films comprising silicon dioxide has less than 2 at-% of nitrogen as an impurity. In other embodiments the films comprise less than 1 at-% of nitrogen, or even less than 0.5 at-% nitrogen as an impurity. Similarly, in some embodiments the thin films comprise less than 1 at-% carbon as an impurity and in some cases less than 0.5 at-% carbon as an impurity.

In some embodiments the deposited films comprising silicon oxide has a step coverage of more than 80%, in other embodiments preferably more than 90% and in other embodiments preferably more than 95%.

Source Materials

In general, the source materials, (e.g., silicon source materials), are preferably selected to provide sufficient vapor pressure, sufficient thermal stability at substrate temperature, and sufficient reactivity of the compounds for effecting deposition by ALD. "Sufficient vapor pressure" typically supplies enough source chemical molecules in the gas phase to the substrate surface to enable self-saturated reactions at the surface at the desired rate. "Sufficient thermal stability" typically means that the source chemical itself does not form growth-disturbing condensable phases on the surface or leave harmful level of impurities on the substrate surface through thermal decomposition. In other words, temperatures are kept above the condensation limits and below the thermal decomposition limits of the selected reactant vapors. One aim is to avoid uncontrolled condensation of molecules on the substrate. "Sufficient reactivity" typically results in self-saturation in pulses short enough to allow for a commercially acceptable throughput time. Further selection criteria include the availability of the chemical at high purity and the ease of handling of the chemical.

In some embodiments, the silicon compound is preferably a disilane and has a Si—Si bond. Organic compounds having a Si—Si bond and an $NH_x$ group either attached directly to silicon (to one or more silicon atoms) or to a carbon chain attached to silicon are used in some embodiments. In some embodiments organosilicon compounds are used, which may or may not comprise Si—Si bonds. More preferably the silicon compound has the formula:

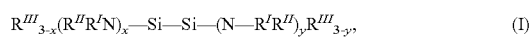

wherein the
x is selected from 1 to 3;
y is selected from 1 to 3;
$R^I$ is selected from the group consisting of hydrogen, alkyl, and substituted alkyl;
$R^{II}$ is selected from the group consisting of alkyl and substituted alkyl; and
$R^{III}$ is selected from the group consisting of hydrogen, hydroxide (—OH), amino (—$NH_2$), alkoxy, alkyl, and substituted alkyl;
and wherein the each x, y, $R^{III}$, $R^{II}$ and $R^I$ can be selected independently from each other.

In some embodiments the silicon compound is hexakis (monoalkylamino)disilane:

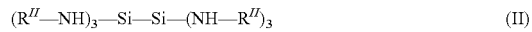

In other embodiments the silicon compound is hexakis (ethylamino)disilane:

In other embodiments the silicon compound is ($CH_3$—O)$_3$—Si—Si—(O—$CH_3$)$_3$ (IV)

Without wishing to be held to a particular theory, the preferred silicon precursors may produce unexpectedly good deposition rates and uniformity because there is a Si—Si bond or because there is a catalytic NH group attached to the Si, or both of these factors.

In some embodiments the silicon compound can be formed during the ALD process such that while the silicon compound is bonding, a new gas-phase silicon compound is formed which in turn is able to bond to hydroxyl and, optionally oxide groups of the growth substrate. This phenomenon is called "in situ" formation of silicon compound.

As discussed above, after the silicon compound is removed, a suitable reactive oxygen source is introduced into the reaction space to convert the silicon compound to silicon dioxide. Preferred oxygen source materials are for example water, oxygen, atomic oxygen, oxygen plasma, oxygen radicals, hydrogen peroxide and the aqueous solutions of hydrogen peroxide and ozone. In some embodiments oxygen sources are used which are more reactive than water towards silicon compounds which contain an organic ligand. In the example provided below, the oxygen source material is ozone ($O_3$). Ozone can be produced by an ozone generator and it is most preferably introduced into the reaction space with the aid of an inert gas of same kind, such as nitrogen, or with the aid of oxygen. In some embodiments ozone is provided at a concentration of from about 5 vol-% to about 40 vol-%, and preferably from about 15 vol-% to about 25 vol-%.

One or more of the following compounds can also be used as the oxygen source material:
  oxides of nitrogen, such as $N_2O$, NO and $NO_2$,
  oxyhalide compounds, for example chlorodioxide ($ClO_2$) and perchloroacid ($HClO_4$),
  peracids (—O—O—H), for example perbenzoic acid ($C_6H_5COOOH$), and peracetic acid ($CH_3COOOH$),
  alcohols, such as methanol ($CH_3OH$) and ethanol ($CH_3CH_2OH$), and
  various radicals, for example oxygen radical (O) or hydroxyl radical (OH).

In other preferred embodiments, methods for forming a silicon dioxide thin film on a substrate in a reaction chamber by atomic layer deposition are provided. The methods comprise a deposition cycle comprising: providing a vapor phase pulse of a first reactant comprising a first silicon source precursor to the reaction chamber such that it forms no more than a monolayer on the substrate; removing excess first reactant from the reaction chamber; providing a vapor phase pulse of a second reactant comprising an oxygen source to the reaction chamber; and removing excess second reactant and any reaction byproducts from the reaction chamber; wherein the providing and removing steps are repeated until a thin silicon dioxide film of a desired thickness is obtained. In some embodiments, the silicon compound is hexakis(monoalkylamino)disilane ($R^{II}$—NH)$_3$—Si—Si—(NH—$R^{II}$)$_3$ and $R^{II}$ is selected from the group consisting of alkyl and substituted alkyl. The process conditions can be as described herein.

In other preferred embodiments, methods for forming a silicon dioxide thin film by atomic layer deposition on a substrate in a reaction chamber are provided comprising: alternately and sequentially providing a vapor phase reactant pulse comprising a silicon precursor and a vapor phase reactant pulse comprising an oxygen precursor to the reaction chamber; wherein the vapor phase reactant pulses are repeated until a thin film of a desired thickness is obtained; wherein the silicon compound is hexakis(ethylamino)disilane (Et-NH)$_3$—Si—Si—(NH-Et)$_3$. The process conditions can be as described herein.

Multicomponent Oxides

A multicomponent film can be achieved by changing the source material, i.e. by growing some other oxide onto the growth substrate between silicon dioxide growth cycles. From the point of view of the invention the growth order of the oxide compounds can be optional.

A multicomponent oxide, usually $MSiO_x$, may be grown by vaporising the metal source material and leading the vaporised metal source material onto the substrate on which it reacts forming one molecular layer on the surface via a ligand exchange reaction and/or dissociation reaction. After the reaction the reaction space is purged carefully with an inert gas to remove the unreacted source material and the reaction products from the reaction space. After this the oxygen source material can be led into the reaction space, with the oxygen source material reacting with the remaining ligands of a chemisorbed metal compound complex (e.g. zirconium complex) forming new OH groups and oxygen bridges on the surface. After the reaction the reaction space is purged again carefully. In the next step the above-described growing cycle of silicon dioxide can be carried out.

One or more metals or semimetals can function as the second cation of the multicomponent oxide (i.e. tertiary oxide). Metals belonging to the groups IIIa, IVa and Va (transition metals) of the periodic table of the elements including the rare earth metals, i.e., lanthane and lanthanoids, as well as the metals and semimetals of group IVb can especially be mentioned of the metals.

As the source material for the metal or semimetal (e.g. germanium) any stable vaporisable compound of metal in question can be used. For example, the following metal source materials could be used: aluminium chloride as an aluminium source material, titanium tetrachloride ($TiCl_4$), as a titanium source material, tantalum pentachloride ($TaCl_5$) as a tantalum source material, hafnium tetrachloride ($HfCl_4$) as a hafnium source material, zirconium tetrachloride ($ZrCl_4$) as a zirconium source material, yttrium betadiketonate (Y(thd)$_3$) as a yttrium source material and lanthanum betadiketonate (La(thd)$_3$) as a lanthanum source material. Other metal source materials that can be used will be apparent to the skilled artisan.

Multicomponent films containing various concentrations of silicon dioxide, e.g. $SiAlO_x$, $SiTiO_x$, $SiTaO_x$, $SiHfO_x$, $SiZrO_x$, $SiYO_x$, $SiLaO_x$ can be grown according to the invention by changing the number of reaction cycles of the silicon source material and ozone (or other oxygen source) as compared to reaction cycles of another metal source material. In the formulae above the amount of oxide can vary and the oxide is not always completely stoichiometric.

The ratio of the amount of the metal oxide and silicon dioxide cycles can be varied to achieve the desired composition. By varying the metal oxide cycle/silicon dioxide cycle ratio in question e.g. from 10:1 to 1:10 the nature of the mixed oxide can be varied in a controlled way from a complete mixed oxide to a nanolaminate structure.

The following non-limiting examples illustrate the some embodiments of the invention:

Example 1

Deposition of Silicon Dioxide from Hexakis(ethylamino)disilane and Ozone $SiO_2$ films were deposited in an atomic layer deposition process using hexakis(ethylamino)disilane and $O_3$. Hexakis(ethylamino)disilane is a liquid Si precursor with relatively low vapour pressure. A vaporization temperature of 110° C. was used. The deposition was carried out on 200 mm silicon wafers in an ASM Pulsar®2000 ALCVD™ reactor. Deposition temperature was varied from 150 to 300° C.

Film thickness and uniformity were measured using a spectroscopic ellipsometer. X-ray reflectometry (XRR) was also used for confirming the thickness as well as for determining the film density. The film composition was studied by both Rutherford backscattering spectroscopy (RBS) and X-ray photoelectron spectroscopy (XPS).

Figure 2A:
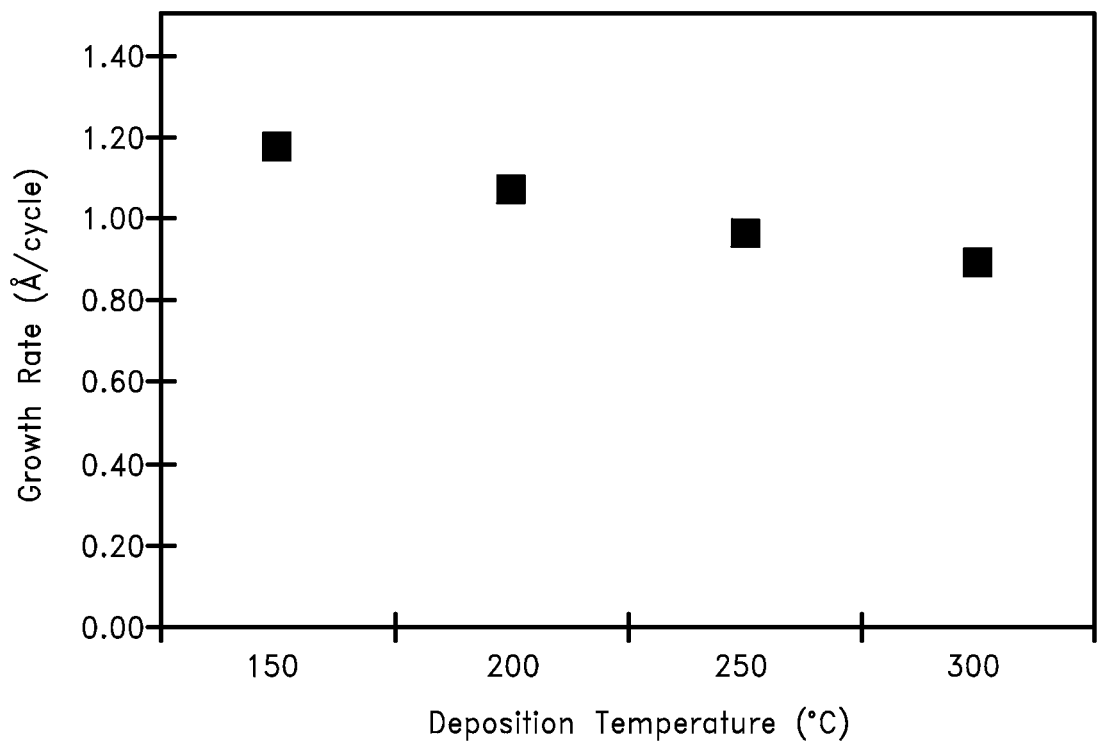
FIG. 2A shows the growth rate of silicon dioxide from hexakis(ethylamino)disilane and ozone at various deposition temperatures.
Figure 2B:
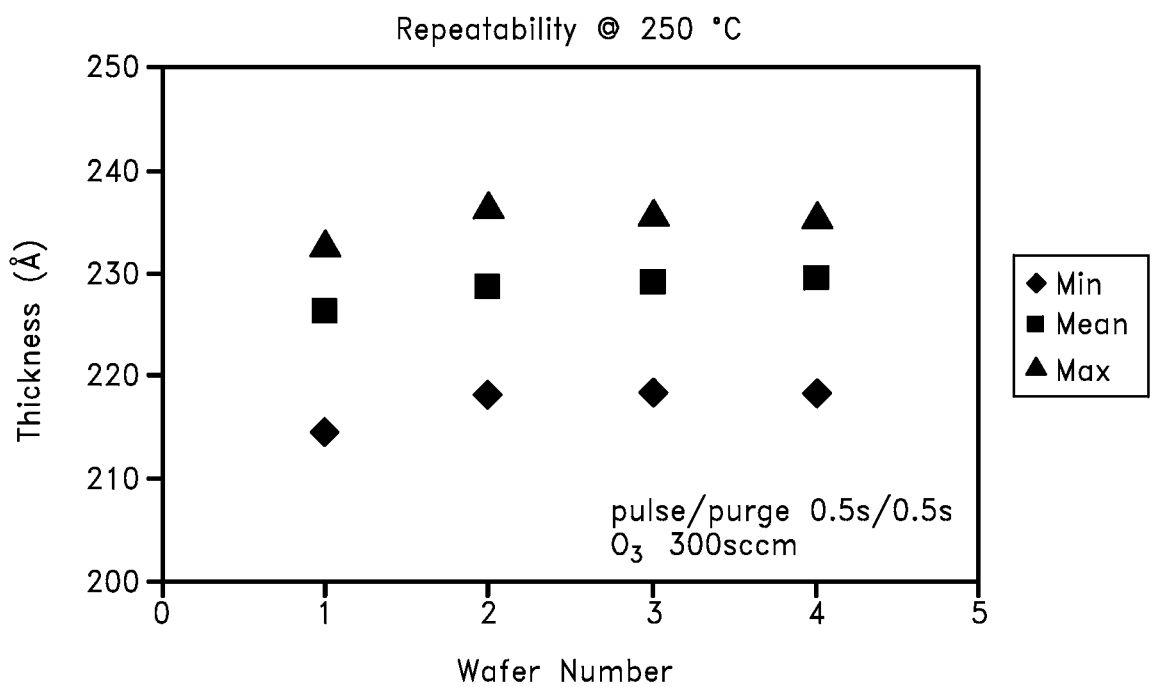
FIG. 2B shows the repeatability of the deposition across various wafers.
Figure 3A:
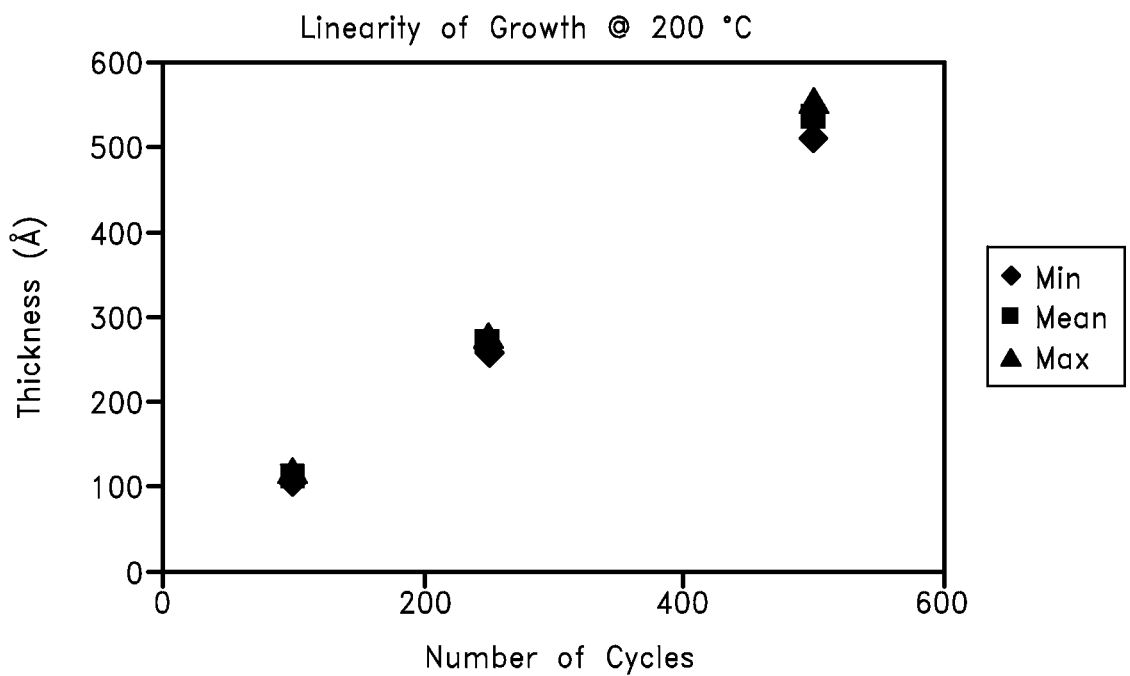
FIG. 3A shows the linearity of growth of silicon dioxide from hexakis(ethylamino)disilane and ozone.
Figure 3B:
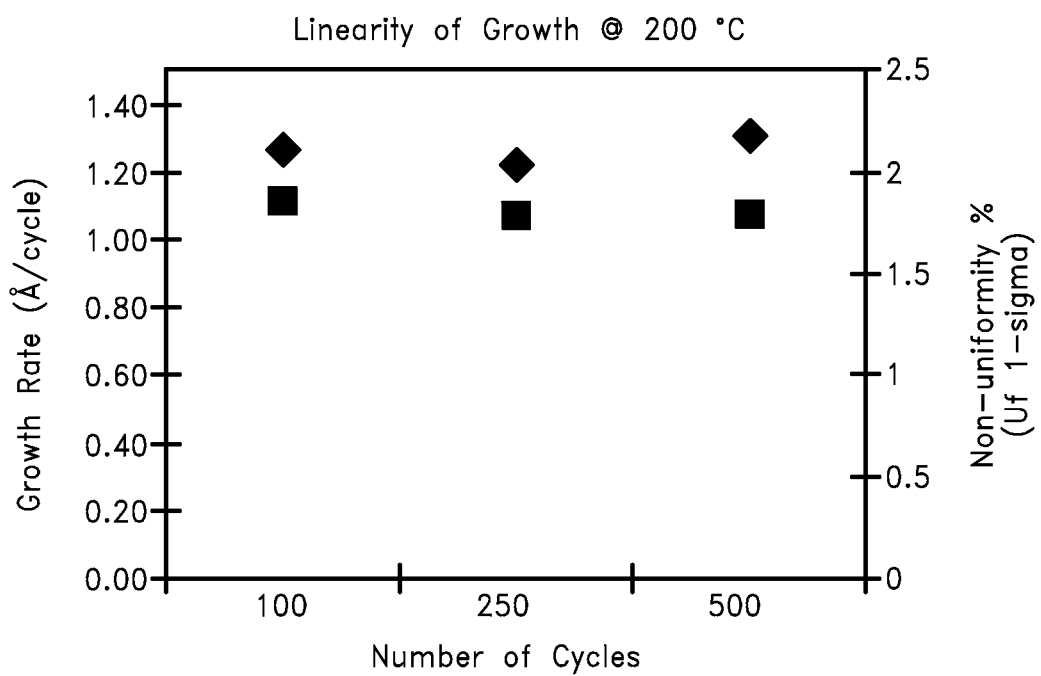
FIG. 3B shows the growth rate (squares) and non-uniformity (diamonds) at 100, 250 and 500 cycles.
Figures 4A, 4B, 4C:
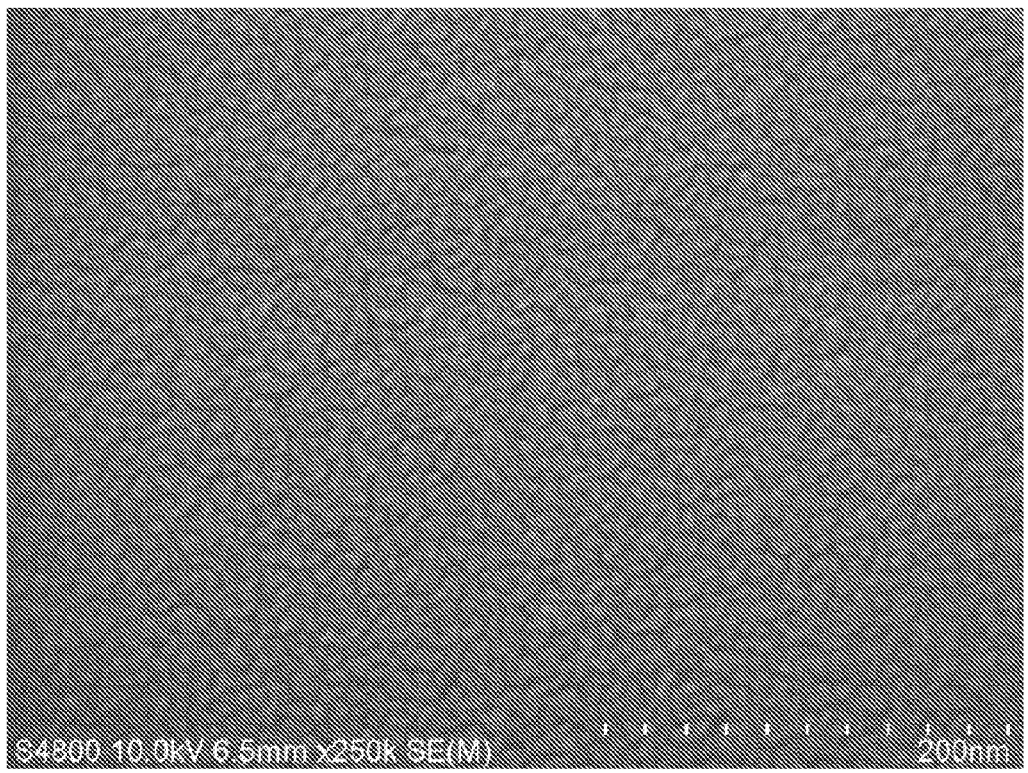
FIG. 4A shows the concentration of C and N and the Si:O ratio in silicon dioxide films deposited from hexakis(ethylamino)disilane and ozone at various deposition temperatures.
FIG. 4B shows the XRR density of the films and FIG. 4C is an SEM image of a silicon dioxide film deposited at 300° C.
Figure 5:
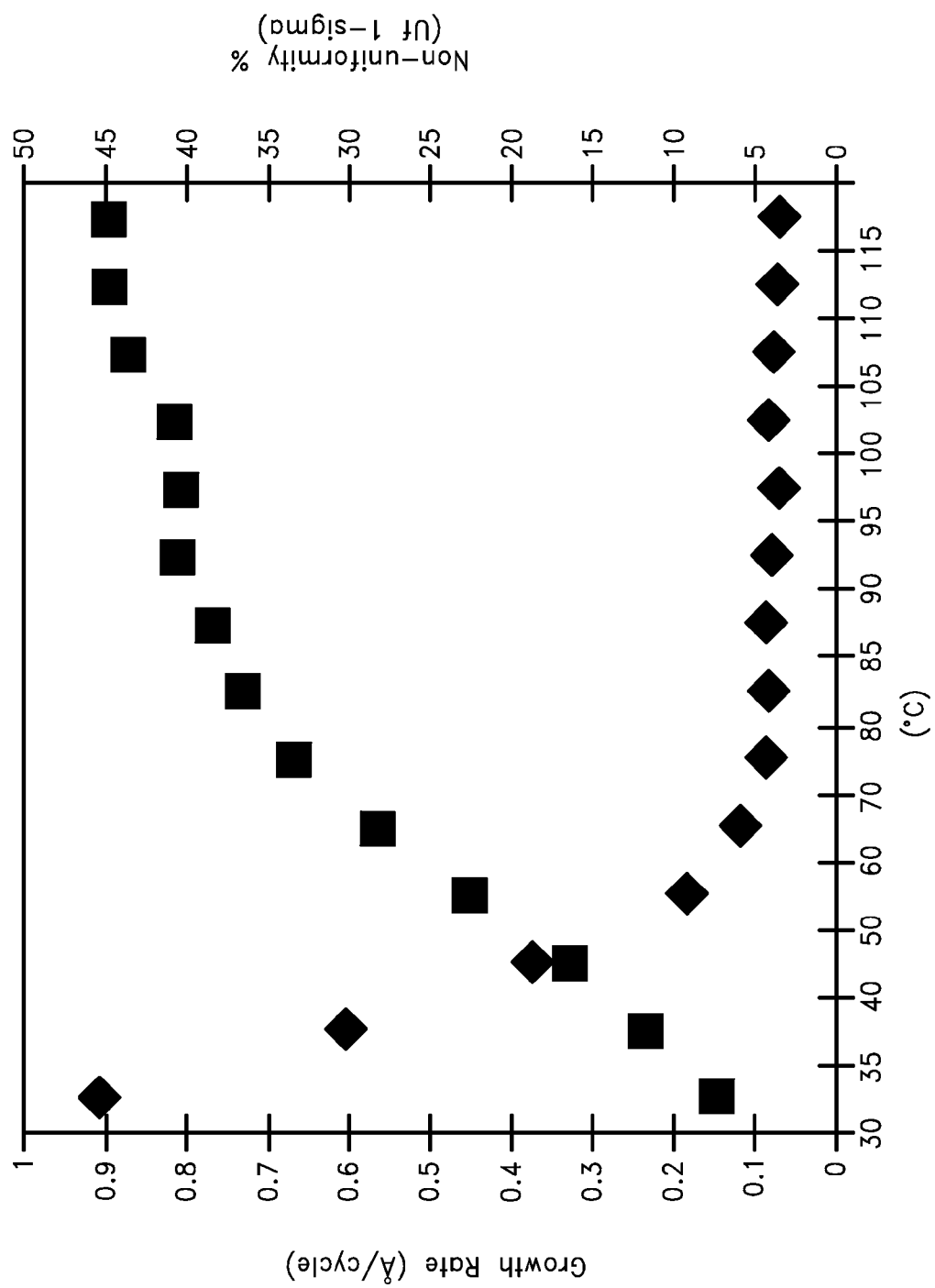
FIG. 5 illustrates the change in growth rate (squares) and non-uniformity (diamonds) observed at various silicon precursor evaporation temperatures (° C.).

Growth rates (Å/cycle) at the various temperatures are presented in FIG. 2A. The repeatability of the process at 250° C. is illustrated in FIG. 2B. FIG. 3A shows the linearity of growth observed at 200° C. FIG. 3B illustrates the growth rate (squares) and non-uniformity (diamonds) is relatively constant from 100 to 500 cycles. FIG. 4A provides concentrations of carbon and nitrogen impurities at various temperatures, as well as the resultant Si:O ratio. FIG. 4B provides the XRR density at the various temperatures and FIG. 4C shows an SEM of a silicon oxide film. FIG. 5 shows an increase in growth rate (squares) and a decrease in non-uniformity (diamonds) over the initial cycles in the deposition process at various silicon precursor temperatures (° C.).

The film thickness and uniformity appeared to depend on deposition temperature and precursor dose. In particular, the $O_3$ dose affected the uniformity and growth rate. The highest growth rates were above 1 Å/cycle and were obtained at the lower temperatures of 150-200° C. On the other hand, the best film uniformities were obtained at the highest temperature of 300° C. According to ellipsometric measurements, the refractive index was the same 1.44 for all the films regardless of deposition temperature. The composition of the film matches $SiO_2$ according to XPS. Also RBS gave the same Si:O ratio of 0.5. The films contain hydrogen, and also some nitrogen and carbon as impurities.

Example 2

Deposition of Silicon Dioxide from Hexakis(ethylamino)disilane and Ozone in a Batch ALD Reactor $SiO_2$ films were deposited in a batch atomic layer deposition process using hexakis(ethylamino)disilane and $O_3$. The deposition was carried out on 300 mm silicon wafers in an ASM A412™ reactor using two injectors, one for each precursor, and with a load of 120 wafers. The deposition temperature was fixed at about 300° C. The hexakis(ethylamino) disilane precursor evaporation rate was about 20 g/hr, which resulted in a flow rate of about 23 sccm from the evaporator. The evaporator was at a temperature of 148° C. The disilane precursor pulses were about 30 s. The oxygen source was ozone, with an ozone flow rate of about 3000 sccm. The ozone pulses were about 10 s. A purging and evacuation step of 10 s was used between the pulses. A scanning electron microscope (SEM) was used to determine the step coverage.

Figure 6:
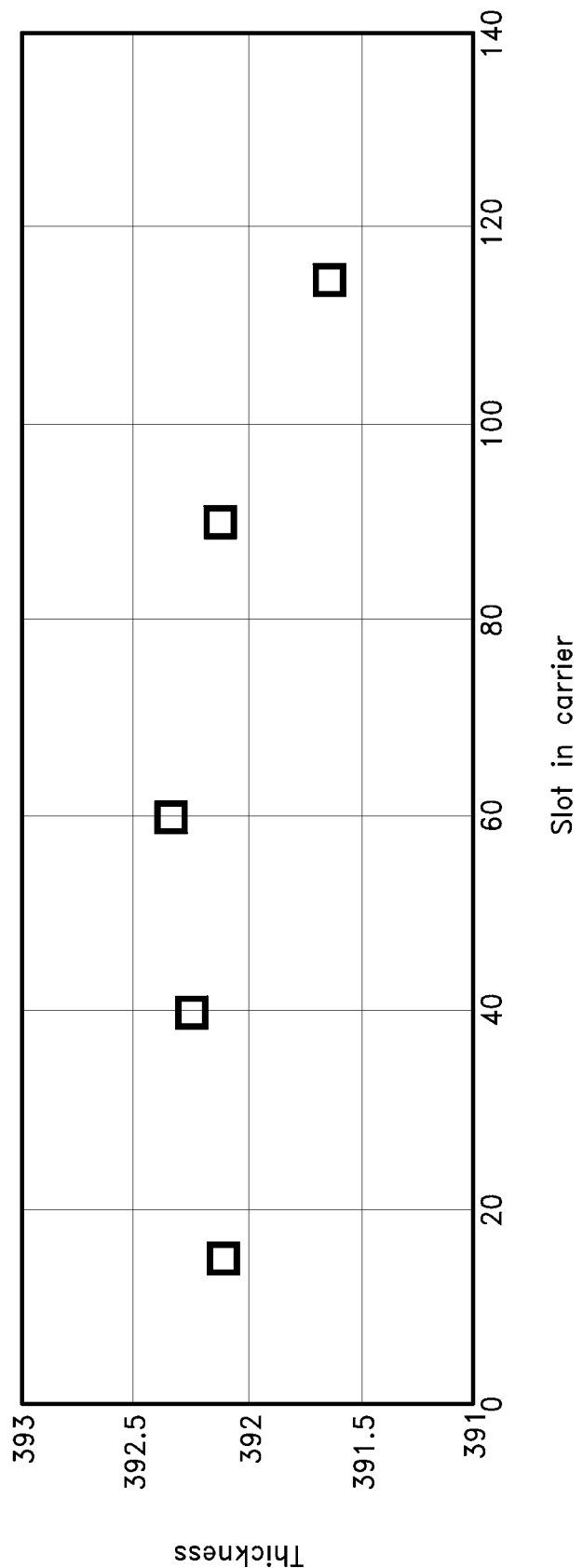
FIG. 6 illustrates the thickness variations between the wafers (i.e. wafer to wafer uniformities) of approximately 400 Å films from a batch load of 120 wafers.
Figure 7A:
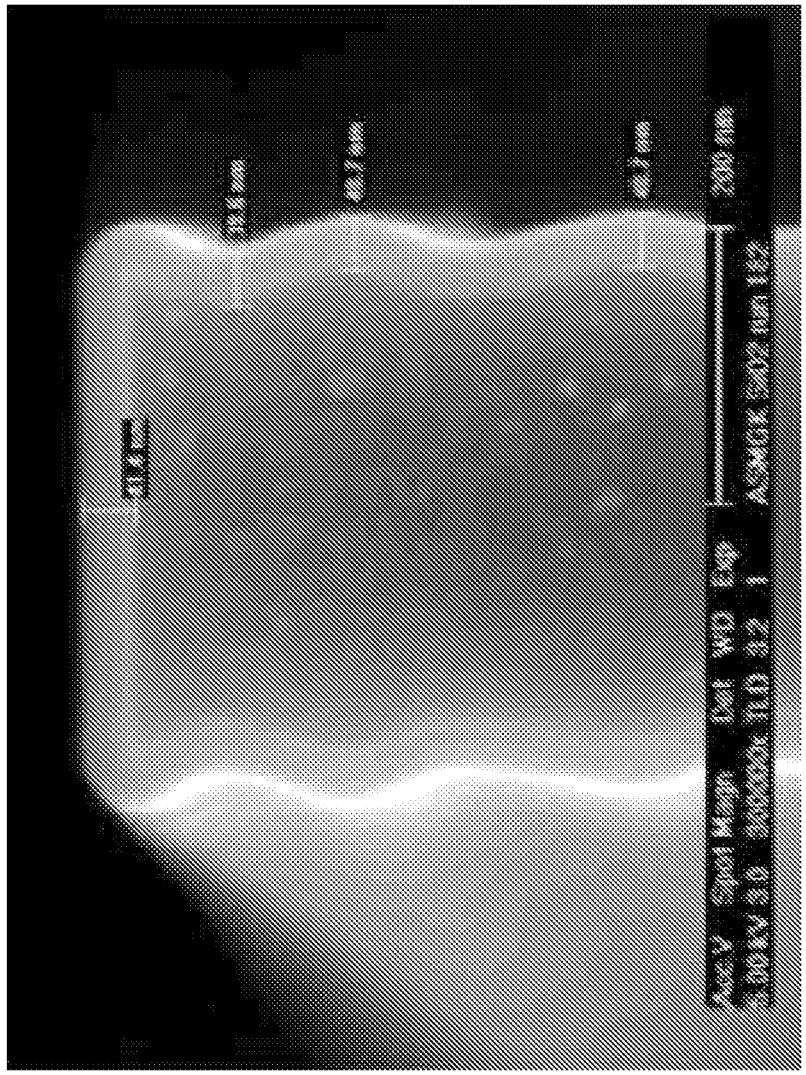
FIGS. 7A-7D illustrate step coverage of about 100%+/−5% of about 400 Å thick $SiO_2$ films.
Figure 7B:
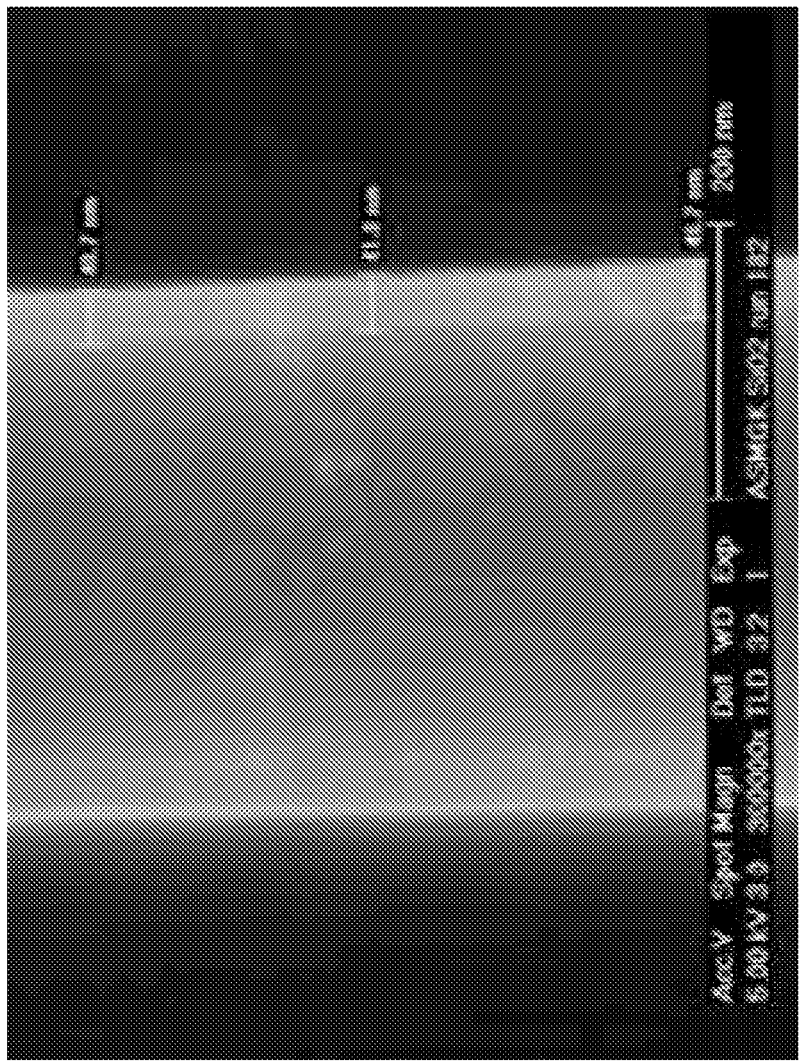
Figure 7C:
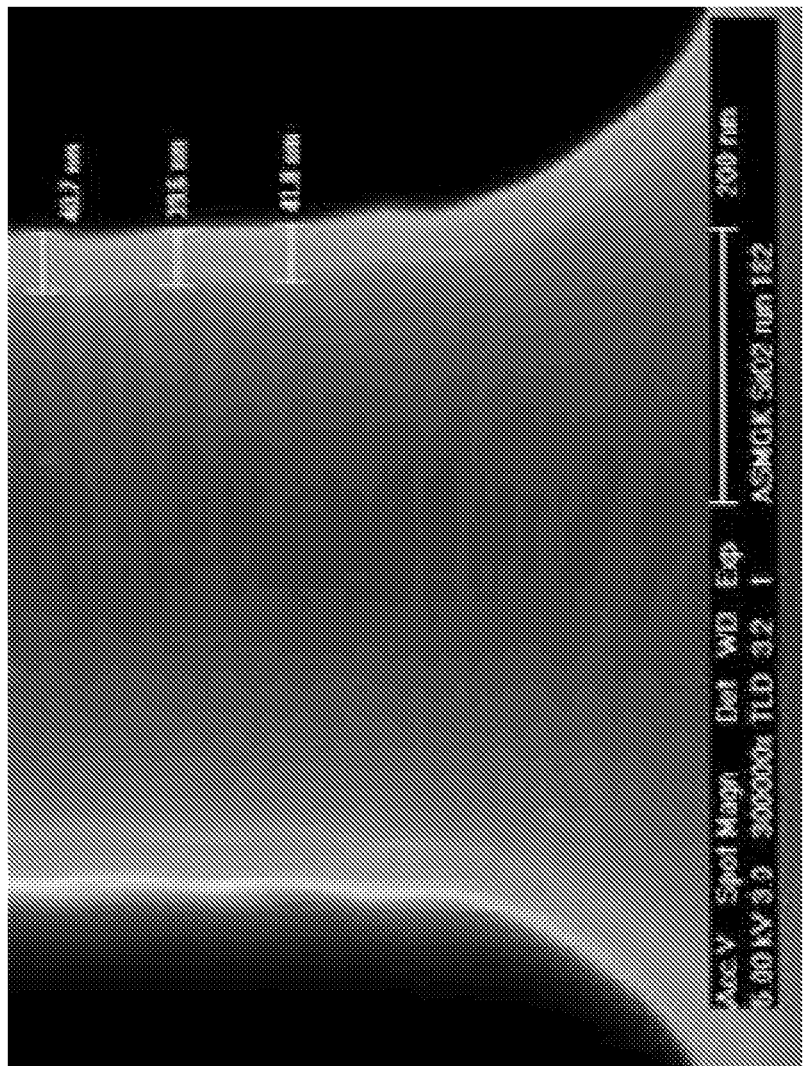
Figure 7D:
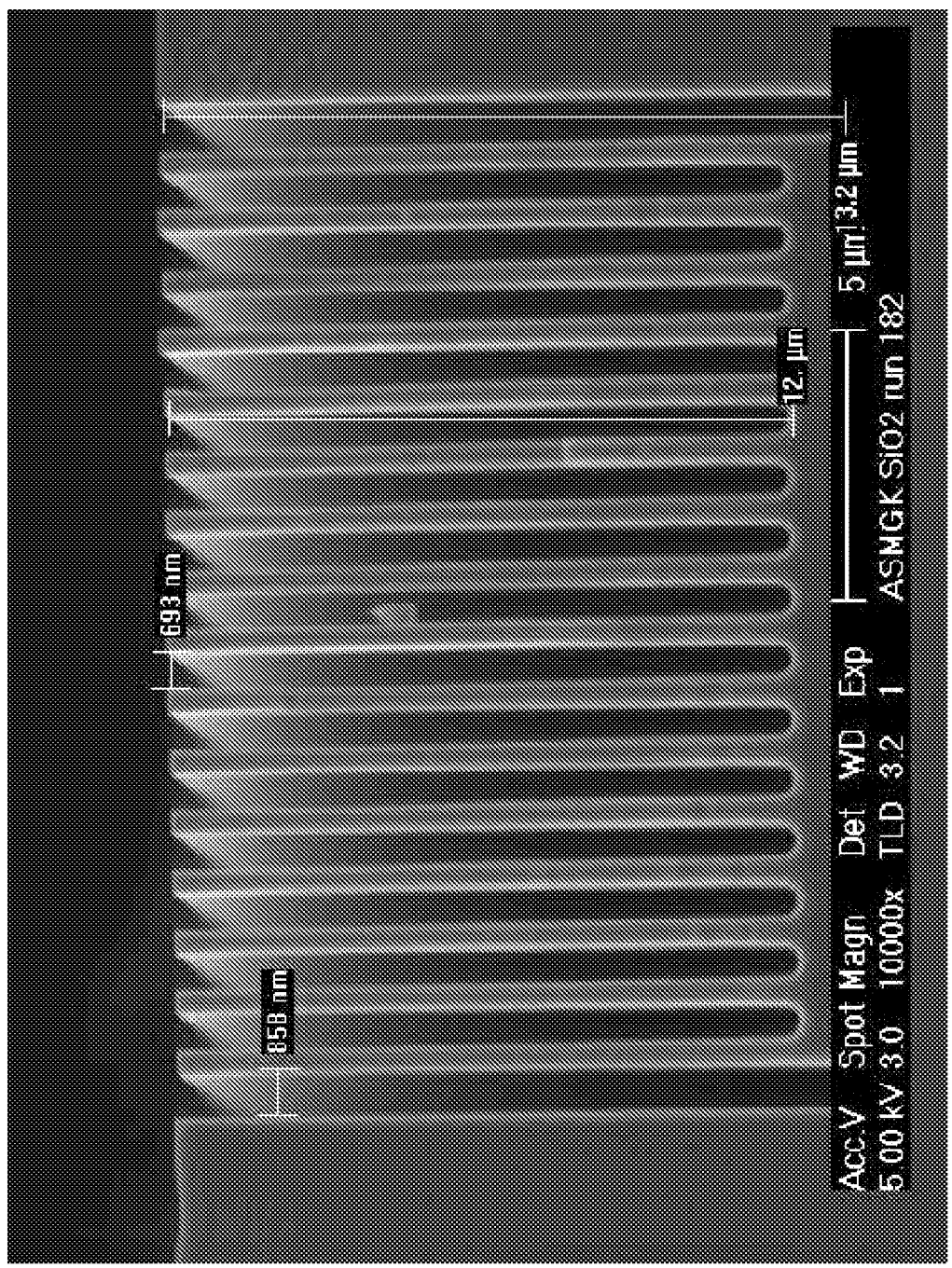

The growth rate was about 1.1 Å/cycle. Within wafer uniformities (thickness variation across a single wafer) of less than 0.5% (full range) were achieved. Minimal thickness variations of less than about 0.2% between the wafers (i.e. wafer to wafer uniformities) of approximately 400 Å films from a batch load of 120 wafers are presented in FIG. 6. A step coverage of about 100%+/−5% of the films is illustrated in the SEM images in FIGS. 7A-7D.

It will be appreciated by those skilled in the art that various modifications and changes can be made without departing from the scope of the invention. Similar other modifications and changes are intended to fall within the scope of the invention, as defined by the appended claims.

We claim:

1. An atomic layer deposition (ALD) process for producing a thin film comprising silicon dioxide on a substrate comprising a deposition cycle comprising:
   contacting a substrate with a vaporized silicon compound such that the silicon compound adsorbs to the substrate; and
   converting the adsorbed silicon compound into silicon dioxide by contacting it with a reactive vaporized oxygen source compound; wherein the silicon compound has a Si—Si bond and formula of:

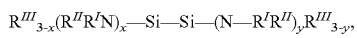

wherein the x is selected from 1 to 3;
   y is selected from 1 to 3;
   $R^I$ is selected from the group consisting of hydrogen, alkyl and substituted alkyl;
   $R^{II}$ is selected from the group consisting of alkyl and substituted alkyl; and
   $R^{III}$ is selected from the group consisting of hydrogen, hydroxide (—OH), amino (—NH2), alkoxy, alkyl and substituted alkyl;
   and wherein each x, y, $R^{III}$, $R^{II}$ and $R^I$ can be selected independently from each other.

2. The process of claim 1, wherein the silicon compound is hexakis(monoalkylamino)disilane ($R^{II}$—NH)$_3$—Si—Si—(NH—$R^{II}$)$_3$.

3. The process of claim 1, wherein the silicon compound is hexakis(ethylamino)disilane (Et-NH)$_3$—Si—Si—(NH-Et)$_3$.

4. The process of claim 1, wherein the deposition cycle is repeated until a silicon dioxide thin film of the desired thickness is formed.

5. The process of claim 1, wherein the temperature of the silicon compound is held above 60° C. during deposition.

6. The process of claim 5, wherein the deposition temperature is from about 150° C. to 350° C.

7. The process of claim 5, wherein the deposition temperature is from about 250° C. to 300° C.

8. The process of claim 1, wherein growth rate of the film is above 0.8 Å/cycle.

9. The process of claim 1, wherein growth rate of the film is above 1.0 Å/cycle.

10. The process of claim 1, wherein contacting a substrate with a vaporized silicon compound comprises supplying the silicon compound in a pulse of about 0.1 to about 5 seconds.

11. The process of claim 1, wherein contacting a substrate with a vaporized oxygen source compound comprises supplying an oxygen source compound in a pulse of about 0.1 to about 5 seconds.

12. The process of claim 1, wherein the process is performed in a flow-type reactor.

13. The process of claim 1, wherein the process is performed in a batch ALD reactor capable of processing more than one substrate.

14. The process of claim 13, wherein the process conditions are selected such that the thickness variation from substrate to substrate processed in the batch ALD reactor is less than about 0.5%.

15. The process of claim 13, wherein the thickness variation within each wafer processed in the batch ALD reactor is less than about 0.5%.

16. The process of claim 13, wherein the batch ALD reactor is capable of processing more than 100 wafers in one batch.

17. The process of claim 1, wherein the oxygen source compound comprises ozone.

18. The process of claim 17, wherein the ozone comprises a mixture of ozone/oxygen, ozone having concentration from about 5 vol-% to about 40 vol-%.

19. The process of claim 1, wherein the oxygen source compound comprises atomic oxygen.

20. The process of claim 1, wherein the oxygen source compound is selected from the group consisting of oxygen plasma and oxygen radicals.

21. The process of claim 1, wherein the deposited film has less than 2 at-% of nitrogen as an impurity.

22. The process of claim 1, wherein the deposited film has less than 1 at-% of carbon as an impurity.

23. The process of claim 1, wherein the process is used for filling trenches.

24. The process of claim 1, wherein the step coverage of the process is more than 90%.

25. The process of claim 1, wherein the process is used for depositing spacers.

26. A method for forming a silicon dioxide thin film on a substrate in a reaction chamber by atomic layer deposition, the method comprising a deposition cycle comprising:
   providing a vapor phase pulse of a first reactant comprising a first silicon source precursor to the reaction chamber such that it forms no more than a monolayer on the substrate;
   removing excess first reactant from the reaction chamber;
   providing a vapor phase pulse of a second reactant comprising an oxygen source to the reaction chamber; and
   removing excess second reactant and any reaction byproducts from the reaction chamber;
   wherein the providing and removing steps are repeated until a thin silicon dioxide film of a desired thickness is obtained, and wherein the silicon compound is hexakis(monoalkylamino)disilane $(R^{II}-NH)_3-Si-Si-(NH-R^{II})_3$ and $R^{II}$ is selected from the group consisting of alkyl and substituted alkyl.

27. The method of claim 25, wherein the deposition temperature is from about 150° C. to 350° C.

28. A method for forming a silicon dioxide thin film by atomic layer deposition on a substrate in a reaction chamber comprising:
   alternately and sequentially providing a vapor phase reactant pulse comprising a silicon precursor and a vapor phase reactant pulse comprising an oxygen precursor to the reaction chamber;
   wherein the vapor phase reactant pulses are repeated until a thin film of a desired thickness is obtained; wherein the silicon compound is hexakis(ethylamino)disilane (Et-NH)$_3$—Si—Si—(NH-Et)$_3$.

29. The method of claim 27, wherein the deposition temperature is from about 250° C. to 300° C.

* * * * *

UNITED STATES PATENT AND TRADEMARK OFFICE
CERTIFICATE OF CORRECTION

PATENT NO.         : 8,501,637 B2
APPLICATION NO.    : 12/340551
DATED              : August 6, 2013
INVENTOR(S)        : Matero et al.

Page 1 of 1

It is certified that error appears in the above-identified patent and that said Letters Patent is hereby corrected as shown below:

In column 2 (title page 1 item 56) at line 25, Under Other Publications, change "IMB" to --IBM--.

In column 1 (title page 2 item 56) at line 33, Under Other Publications, change "AI2O3" to --Al2O3--.

In column 2 (title page 2 item 56) at line 4, Under Other Publications, change "Chrystalline" to --Crystalline--.

In column 2 (title page 2 item 56) at line 13, Under Other Publications, change "Capor" to --Vapor--.

In the Specification:
In column 6 at line 67, change "compound" to --compound.--.

In the Claims:
In column 14 at line 7, In Claim 27, change "claim 25," to --claim 26,--.
In column 14 at line 20, In Claim 29, change "claim 27," to --claim 28,--.

Signed and Sealed this
Thirteenth Day of May, 2014

Michelle K. Lee
*Deputy Director of the United States Patent and Trademark Office*